(12) United States Patent
Yang et al.

(10) Patent No.: US 11,086,211 B2
(45) Date of Patent: Aug. 10, 2021

(54) MASKS AND METHODS OF FORMING THE SAME

(71) Applicant: Taiwan Semiconductor Manufacturing Co., Ltd., Hsinchu (TW)

(72) Inventors: Shih-Hao Yang, Tainan (TW);
Chih-Chiang Tu, Tauyen (TW);
Chun-Lang Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 141 days.

(21) Appl. No.: 15/940,969

(22) Filed: Mar. 30, 2018

(65) Prior Publication Data

US 2019/0137862 A1 May 9, 2019

Related U.S. Application Data

(60) Provisional application No. 62/583,476, filed on Nov. 8, 2017.

(51) Int. Cl.
*G03F 1/32* (2012.01)
*G03F 1/48* (2012.01)
*G03F 1/76* (2012.01)
*G03F 1/80* (2012.01)

(52) U.S. Cl.
CPC .................. *G03F 1/32* (2013.01); *G03F 1/48* (2013.01); *G03F 1/76* (2013.01); *G03F 1/80* (2013.01)

(58) Field of Classification Search
CPC ..... G03F 1/32; G03F 1/48; G03F 1/76; G03F 1/80; G03F 1/38
See application file for complete search history.

(56) References Cited

U.S. PATENT DOCUMENTS

| | | | |
|---|---|---|---|
| 8,796,666 B1 | 8/2014 | Huang et al. | |
| 9,012,132 B2 | 4/2015 | Chang | |
| 9,093,530 B2 | 4/2015 | Huang et al. | |
| 9,028,915 B2 | 5/2015 | Chang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,851,632 B2 * | 12/2017 | Nam | G03F 1/26 |

(Continued)

FOREIGN PATENT DOCUMENTS

| | | | | |
|---|---|---|---|---|
| JP | 06-250376 | * | 9/1994 | ............... G03F 1/08 |
| JP | 2007-241137 | * | 9/2007 | ............... G03F 1/08 |

(Continued)

OTHER PUBLICATIONS

"Office Action of Taiwan Counterpart Application," dated May 7, 2019, p. 1-p. 4.

*Primary Examiner* — Martin J Angebranndt
(74) *Attorney, Agent, or Firm* — JCIPRNET

(57) ABSTRACT

Masks and methods of forming the same are disclosed. The mask includes a substrate, a phase shift layer, a shading layer and a passivation layer. The phase shift layer is disposed over the substrate. The shading layer is disposed over the phase shift layer. The passivation layer is disposed over and in physical contact with the shading layer.

20 Claims, 4 Drawing Sheets

(56) References Cited

U.S. PATENT DOCUMENTS

| | | | |
|---|---|---|---|
| 2005/0190450 A1* | 9/2005 | Becker | G03F 1/26 |
| | | | 359/601 |
| 2007/0128528 A1* | 6/2007 | Hess | B82Y 10/00 |
| | | | 430/5 |
| 2007/0212618 A1* | 9/2007 | Yoshikawa | G03F 1/32 |
| | | | 430/5 |
| 2011/0250529 A1* | 10/2011 | Nozawa | G03F 1/34 |
| | | | 430/5 |
| 2013/0309600 A1* | 11/2013 | Fukaya | G03F 1/50 |
| | | | 430/5 |
| 2016/0054650 A1* | 2/2016 | Nam | G03F 1/26 |
| | | | 430/5 |
| 2017/0123305 A1* | 5/2017 | Watanabe | G03F 1/54 |
| 2018/0259842 A1* | 9/2018 | Inazuki | G03F 1/80 |
| 2018/0284603 A1* | 10/2018 | Iino | H01J 37/32743 |
| 2018/0299767 A1* | 10/2018 | Nozawa | G03F 1/80 |
| 2018/0335691 A1* | 11/2018 | Nam | G03F 1/26 |

FOREIGN PATENT DOCUMENTS

| | | | | |
|---|---|---|---|---|
| JP | 2009-122313 | * | 6/2009 | G03F 1/08 |
| JP | 2017-146628 | * | 8/2017 | G03F 1/80 |
| TW | 362168 | | 6/1999 | |
| TW | 200717178 | | 5/2007 | |
| TW | 201439062 | | 10/2014 | |
| TW | 201704864 | | 2/2017 | |

* cited by examiner

MASKS AND METHODS OF FORMING THE SAME

CROSS-REFERENCE TO RELATED APPLICATION

This application claims the priority benefit of U.S. provisional application Ser. No. 62/583,476, filed on Nov. 8, 2017. The entirety of the above-mentioned patent application is hereby incorporated by reference herein and made a part of this specification.

BACKGROUND

Photolithography is utilized in the fabrication of semiconductor devices to transfer a pattern onto a wafer. Based on various integrated circuit (IC) layouts, patterns are transferred from a photomask (or a reticles) to a surface of the wafer. As dimensions decrease and density in IC chips increases, resolution enhancement techniques, such as optical proximity correction (OPC), off-axis illumination (OAI), double dipole lithography (DDL) and phase-shift mask (PSM), are developed to improve depth of focus (DOF) and therefore to achieve a better pattern transfer onto the wafer.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
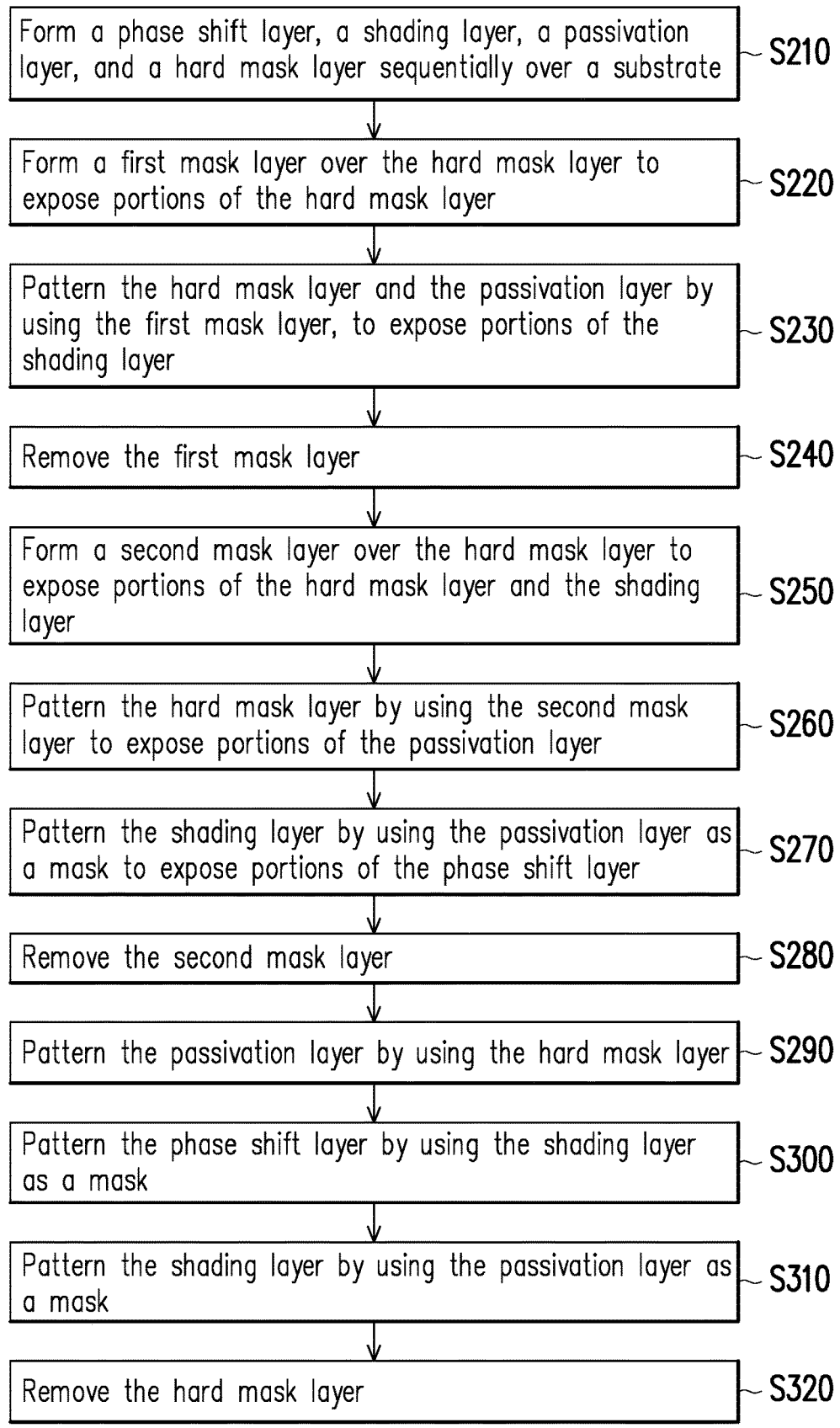
FIG. 1 is a flow chart of a method of fabricating a mask in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 2A:
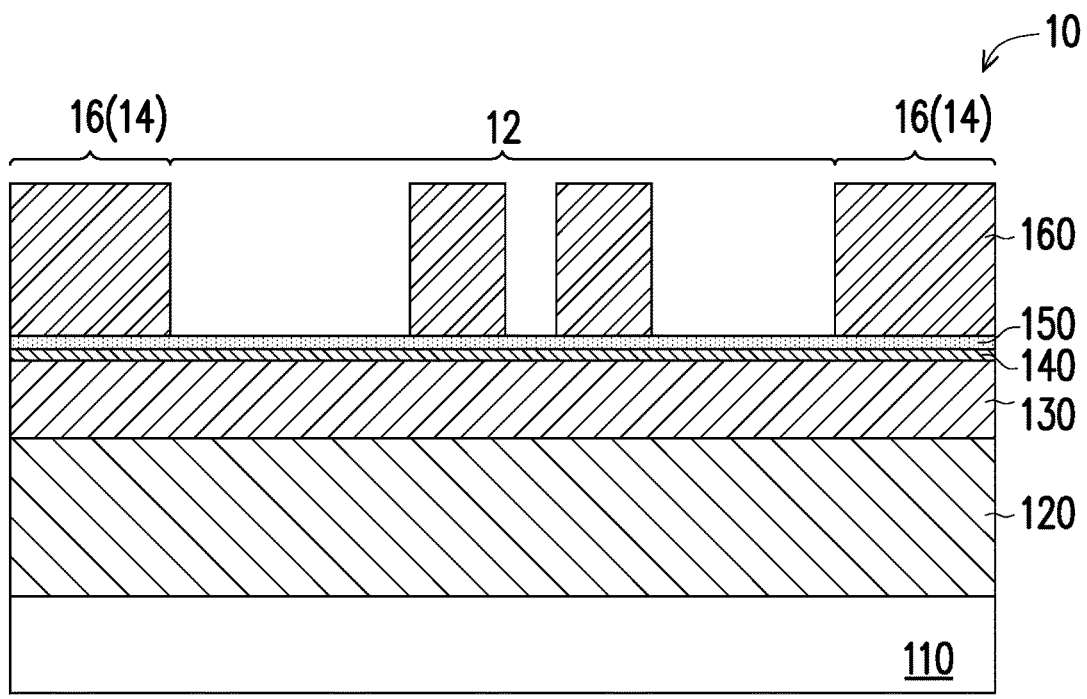
FIGS. 2A-2E are schematic cross-sectional views illustrating a method of fabricating a mask 10 in accordance with some embodiments of the disclosure.

FIG. 1 is a flow chart of a method of fabricating a mask in accordance with some embodiments of the disclosure. FIGS. 2A-2E are schematic cross-sectional views illustrating a method of fabricating a mask 10 in accordance with some embodiments of the disclosure. FIG. 3 is a schematic top view illustrating the mask 10 in accordance with some embodiments of the disclosure. Referring to FIGS. 1 and 2A, at step S210, a phase shift layer 120, a shading layer 130, a passivation layer 140, and a hard mask layer 150 are sequentially formed over a substrate 110.

In some embodiments, the substrate 110 may be formed of quartz glass, synthetic quartz glass, or fluorine-doped quartz glass. In some embodiments, the substrate 110 is deemed transparent under near ultra violet (NUV) wavelengths (e.g., less than 365 nanometers (nm)). In some embodiments, the substrate 110 is deemed transparent under deep ultra violet (DUV) wavelengths (e.g., less than 248 nm). In some embodiments, the substrate 110 is deemed transparent under argon fluoride (ArF) laser (e.g., 193 nm).

In some embodiment, a material of the phase shift layer 120 includes a MoSi (molybdenum silicon) compound or the like. The MoSi compound, for example, includes at least one among MoSi, MoSiCON, MoSiON, MoSiCN, MoSiCO, MoSiO, MoSiC, and MoSiN. As illustrated in FIG. 2A, the phase shift layer 120 is directly disposed on the substrate 110 and immediately underneath the shading layer 130. However, the disclosure is not limited thereto. In some alternative embodiments, additional layer may be presented between the substrate 110 and the phase shift layer 120 and/or between the phase shift layer 120 and the shading layer 130.

In some embodiment, the shading layer 130 may include metals, metal oxides, or other suitable materials. For example, the shading layer 130 may include a tantalum-containing material (for example, Ta, TaN, TaNH, TaHf, TaHfN, TaBSi, TaB-SIN, TaB, TaBN, TaSi, TaSiN, TaGe, TaGeN, TaZr, TaZrN, other tantalum-containing material, or combinations thereof), a chromium-containing material (for example, Cr, CrN, CrO, CrC, CrON, CrCN, CrOC, CrOCN, other chromium-containing material, or combinations thereof), a titanium-containing material (for example, Ti, TiN, other titanium-containing material, or combinations thereof), other suitable material, or combinations thereof. The material of the shading layer 130 is not limited herein as long as such material is able to block incident light.

In some embodiment, the passivation layer 140 includes a material that protects the shading layer 130 during processing of a mask 10. In some embodiment, the materials of the passivation layer 140 and the phase shift layer 120 have similar material characterization to an etchant used to remove the shading layer 130 or the hard mask layer 150. The passivation layer 140 may include a silicon-containing material, such as silicon nitride, silicon oxide, or MoSi or other suitable material. In some embodiments, the passivation layer 140 has a thickness of about 3.5 nm to about 5 nm.

In some embodiments, the hard mask layer 150 includes a material that protects the passivation layer 140 during processing of the mask 10. In some embodiment, the materials of the hard mask layer 150 and the shading layer 130 have similar material characterization to an etchant used to remove the passivation layer 140 or the phase shift layer 120. In some embodiments, the hard mask layer 150 includes a chromium-containing material, such as Cr, CrN, CrO, CrC, CrON, CrCN, CrOC, CrOCN, other chromium-containing material, or combinations thereof. In some alternative embodiments, the hard mask layer 150 includes a tantalum-containing material, such as Ta, TaN, TaNH, TaHf, TaHfN, TaBSi, TaB-SiN, TaB, TaBN, TaSi, TaSiN, TaGe, TaGeN, TaZr, TaZrN, other tantalum-containing material, or combinations thereof. In some embodiments, the hard mask layer 150 has a thickness of about 3.5 nm to about 5 nm. It is noted that, in some alternative embodiments, the passivation layer 140 and hard mask layer 150 may include multiple layers.

The phase shift layer 120, the shading layer 130, the passivation layer 140 and the hard mask layer 150 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD (APCVD), low pressure CVD (LPCVD), plasma enhanced CVD (PECVD), or high density plasma CVD (HDPCVD)), ion beam deposition, spin-on coating, metal-organic decomposition (MOD), other suitable methods, or combinations thereof.

Referring to FIGS. 2A and 3, in some embodiments, the mask 10 is a phase shift mask, such as an attenuated phase shift mask (AttPSM) or an alternating phase shift mask (AltPSM). The mask 10 includes an image region 12 and a frame region 14. The image region 12 is an area of the mask 10 that will include a pattern (or design) of a layer of an integrated circuit device (or chip). For example, the mask 10 will include a pattern (or design) of a layer of a resistor, a capacitor, an inductor, a diode, a metal-oxide-semiconductor field effect transistor (MOSFET), a complementary MOS (CMOS) transistor, a bipolar junction transistor (BJT), a laterally diffused MOS (LDMOS) transistor, a high power MOS transistor, a fin-like field effect transistor (FinFET), other integrated circuit component, or combination thereof. The frame region 14 is an area of the mask 10 that will not include the pattern of the layer of the integrated circuit device. The frame region 14 will include a pattern (or designs) that define alignment marks (also referred to as fiducial marks). The frame region 14 borders the image region 12 and, in some embodiments, the frame region 14 surrounds (or defines the area of) the image region 12. In some embodiments, an image border region 16 of the mask 10 represents an area of the mask 10 that is outside the image region 12. In some embodiments, the image border region 16 is a portion of the frame region 14 that is adjacent to the image region 12. The mask 10 will be used to transfer the pattern of the image region 12 to a wafer.

Figure 2B:
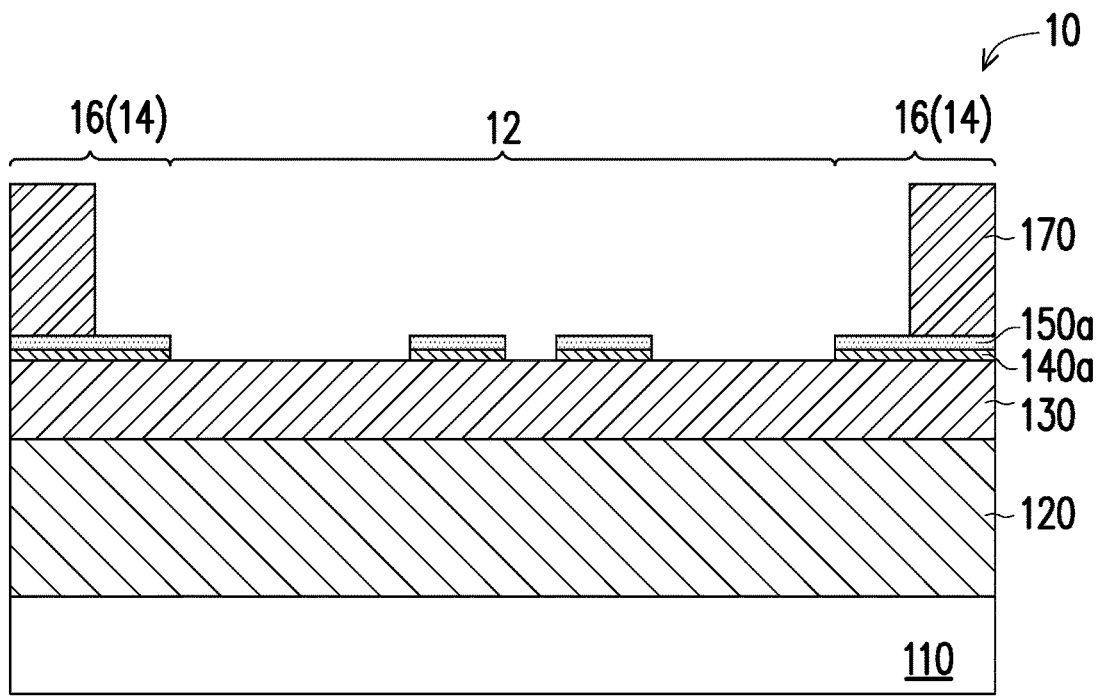
Figure 3:
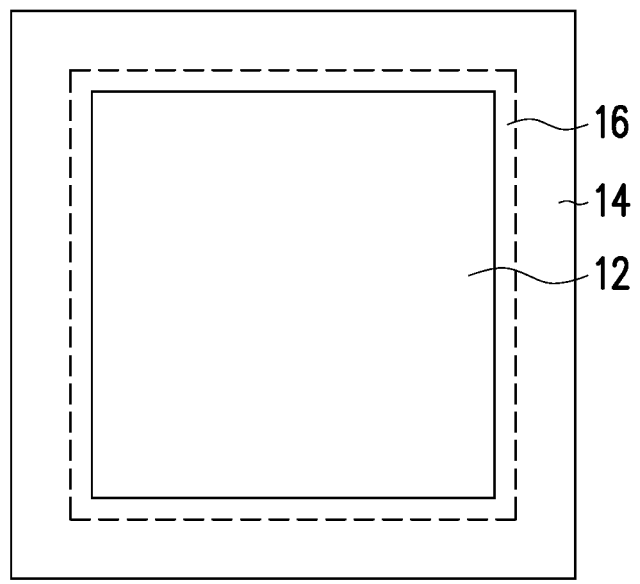
FIG. 3 is a schematic top view illustrating the mask in accordance with some embodiments of the disclosure.

Referring to FIGS. 1, 2A and 2B, at step S220, a first mask layer 160 is formed over the hard mask layer 150 to expose portions of the hard mask layer 150. In some embodiments, patterns of the first mask layer 160 are the same as patterns to be transferred onto the phase shift layer 120 in the subsequent processes. In some embodiments, the first mask layer 160 may be a photoresist layer. In some embodiments, the first mask layer 160 may be a chemically amplified resist that employs acid catalysis. For example, the first mask layer 160 may be formulated by dissolving an acid sensitive polymer in a casting solution. In some embodiments, the first mask layer 160 may be a positive tone photoresist which would render the patterns subsequently formed having the same contour as the patterns on a mask (not illustrated). In some alternative embodiments, the photoresist layer may be a negative tone photoresist which would render the patterns subsequently formed having openings corresponding to the patterns on the mask (not illustrated).

In some embodiments, the first mask layer 160 may be formed by forming a mask layer and performing an exposure process to the mask layer. The exposure process may include a lithography technique with a mask (for instance, a photolithography process) or a mask-less lithography technique (for instance, an electron-beam (e-beam) exposure process or an ion-beam exposure process). After the exposure process, a post-baking process may be performed to harden at least a portion of the mask layer. Depending on the material(s) or type(s) of the mask layer, polymers of the mask layer may undergo different reactions (chain scission or cross-linking of polymers) upon the irradiation of the light beam and baking. Thereafter, a development process is performed to remove at least a portion of the mask layer. In some embodiments, portions of the positive resist material exposed to the light beam may undergo chain scission reaction, resulting the exposed portions to be easily removed by a development agent as compared to other portions not exposed to the light beam. On the other hand, portions of the negative resist material exposed to the light beam may undergo the cross-linking reaction, resulting the exposed portions to be harder to remove by a development agent as compared to other portions not exposed to the light beam. In some embodiments, the first mask layer 160 exposes at least a portion of the underlying hard mask layer 150.

At step S230, the hard mask layer 150 and the passivation layer 140 are patterned by using the first mask layer 160, to expose portions of the shading layer 130. In some embodiments, since the hard mask layer 150 and the passivation layer 140 have different material characterization, the hard mask layer 150 and the passivation layer 140 are patterned by different etching processes. For example, a first etching process is performed to the hard mask layer 150 to remove portions of the hard mask layer 150 from the image region 12, so as to transfer the pattern onto the hard mask layer 150. The first etching process includes a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In some embodiments, the first etching process uses a dry etching process that selectively etches the hard mask layer 150. For example, the first etching process uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof).

After portions of the hard mask layer 150 is removed, a second etching process is performed to the passivation layer 140 to remove portions of the passivation layer 140 from the image region 12, so as to transfer the pattern onto the passivation layer 140. The second etching process includes a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In some embodiments, the second etching process uses a dry etching process that selectively etches the passivation layer 140. For example, the second etching process uses a fluoride-containing gas (such as $CF_4$, $CHF_3$, $C_2F_6$, $CH_2F_2$, $SF_6$, other fluoride-containing gas, or combinations thereof). Thereafter, the patterned resist layer 160 is removed, as illustrated in FIG. 2B (for example, by a resist stripping process), leaving a hard mask layer 150a and a passivation layer 140a.

Referring to FIG. 2B, at step S240, the first mask layer 160 is removed. The first mask layer 160 may be removed through, for example, a resist stripping process or a resist ashing process. Then, referring to FIGS. 1 and 2B, at step S250, a second mask layer 170 is formed over the hard mask layer 150a to expose portions of the hard mask layer 150a and the shading layer 130. In some embodiments, openings within the second mask layer 170 expose portions of the hard mask layer 150a and portions of the shading layer 130 exposed by the hard mask layer 150a and the passivation layer 140a.

Figure 2C:
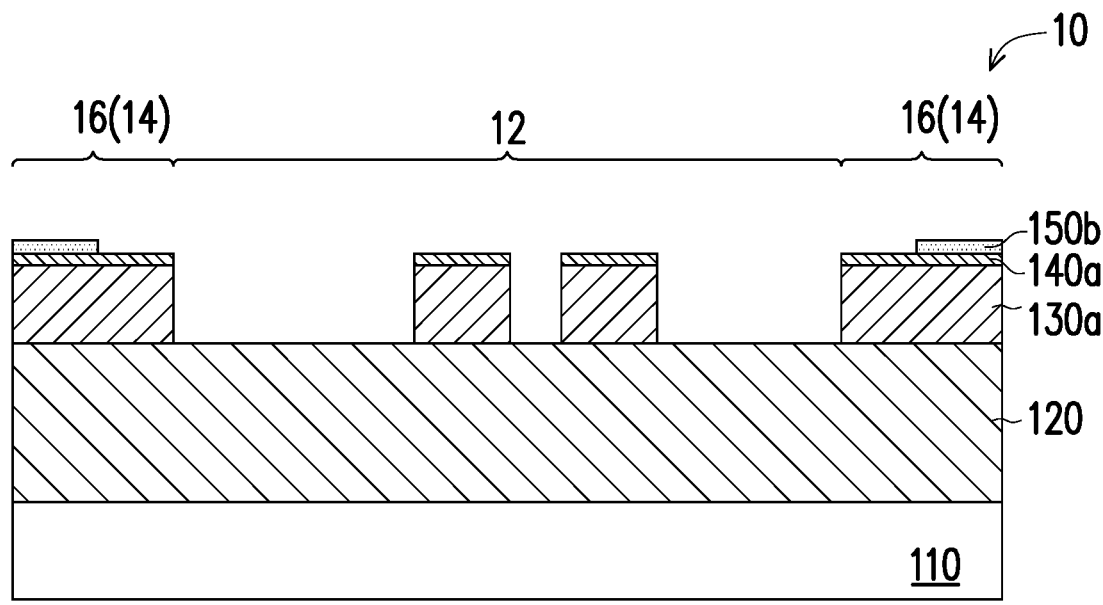

Referring to FIGS. 1, 2B and 2C, at step S260, the hard mask layer 150a is patterned by using the second mask layer 170 to expose portions of the passivation layer 140a. At step S270, the shading layer 130 is patterned by using the passivation layer 140a as a mask to expose portions of the phase shift layer 120. In some embodiments, the hard mask layer 150a is partially removed from the image border region 16 of the frame region 14, and the shading layer 130 is partially removed from the image region 12. The hard mask layer 150a and the shading layer 130 may be removed in the same etching process or separately. In some embodiments, the exposed portions of the hard mask layer 150a and the shading layer 130 may be removed simultaneously by an etching process since the hard mask layer 150a and the shading layer 130 have similar material characterization. In some embodiments, the etching process uses a dry etching process that selectively etches the hard mask layer 150a and the shading layer 130. For example, the etching process uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). In some embodiments, the passivation layer 140a and the phase shift layer 120 include a material having a different material characterization than the hard mask layer 150a and the shading layer 130, such that the passivation layer 140a and the phase shift layer 120 act as etch stop layers during the etching process for patterning the hard mask layer 150a and the shading layer 130. The etching processes thus selectively remove the hard mask layer 150a and the shading layer 130 without removing the passivation layer 140a and the phase shift layer 120. Thereafter, at step S280, the second mask layer 170 is removed, as illustrated in FIG. 2C (for example, by a resist stripping process), leaving a hard mask layer 150b and a shading layer 130a.

Figure 2D:
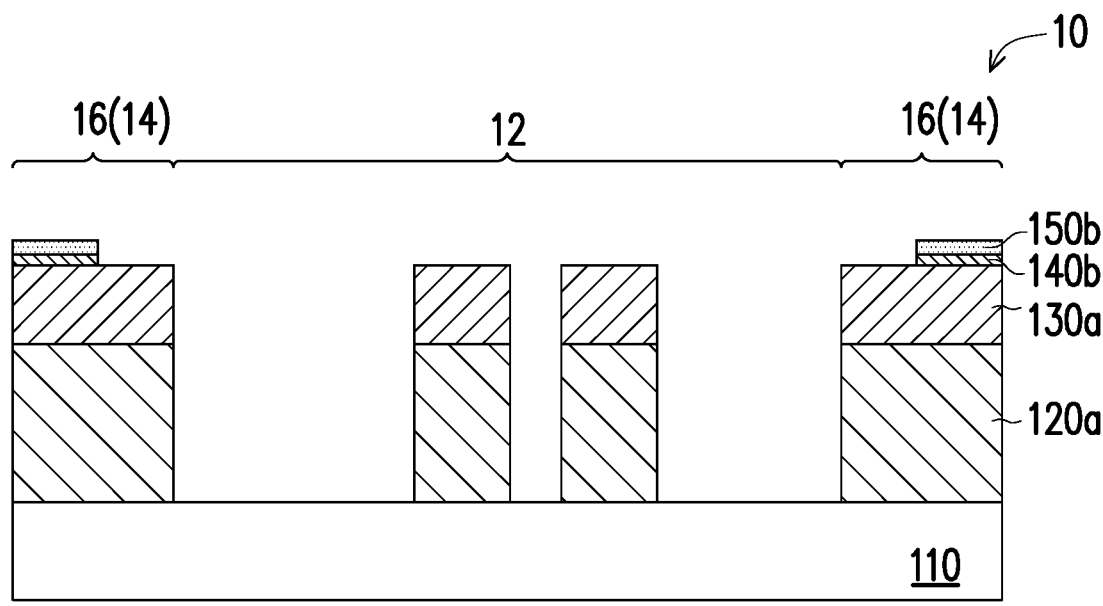

Referring to FIGS. 1, 2C and 2D, at step S290, the passivation layer 140a is patterned by using the hard mask layer 150b, and at step S300, the phase shift layer 120 is patterned by using the shading layer 130a as a mask. In some embodiments, the passivation layer 140a is partially removed from the image border region 16 of the frame region 14, and the phase shift layer 120 is partially removed from the image region 12. In some embodiments, the passivation layer 140a and the phase shift layer 120 may be removed in the same etching process or separately. In some embodiments, the passivation layer 140a and the phase shift layer 120 are removed simultaneously by an etching process since the passivation layer 140a and the phase shift layer 120 have similar material characterization. In some embodiments, the etching process uses a dry etching process that selectively etches the passivation layer 140a and the phase shift layer 120. For example, the etching process uses a fluoride-containing gas (such as $CF_4$, $CHF_3$, $C_2F_6$, $CH_2F_2$, $SF_6$, other fluoride-containing gas, or combinations thereof). In some embodiments, the hard mask layer 150b and the shading layer 130a include a material having a different material characterization than the passivation layer 140a and the phase shift layer 120. Therefore, during the etching process for removing portions of the passivation layer 140a, the hard mask layer 150b can be used as a mask, and the shading layer 130a can act as an etch stop layer. Similarly, during the etching process for removing portions of the phase shift layer 120, the shading layer 130a can be used as a mask. The etching process thus selectively removes the passivation layer 140a and the phase shift layer 120 without removing the hard mask layer 150b and the shading layer 130a, and a passivation layer 140b and a phase shift layer 120a are formed as shown in FIG. 2D.

Figure 2E:
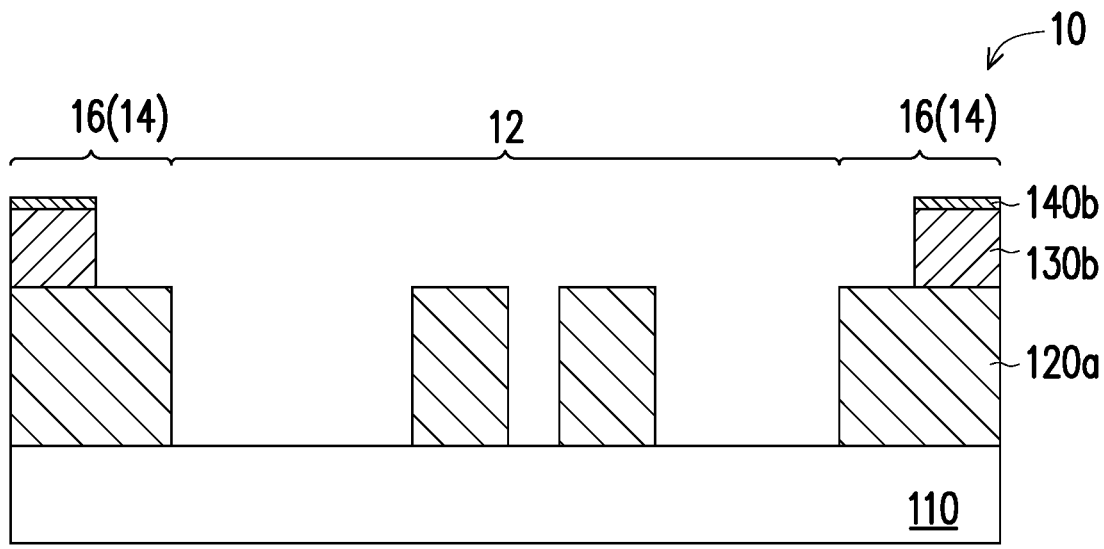

Referring to FIGS. 1, 2D and 2E, at step S310, the shading layer 130a is patterned by using the passivation layer 140b as a mask, and at step S320, the hard mask layer 150b is removed. In some embodiments, the shading layer 130a is removed from the image border region 16 of the frame region 14. The shading layer 130a and the hard mask layer 150b may be removed at the same time or separately. In some embodiments, portions of the shading layer 130a and the hard mask layer 150b are removed at the same time by an etching process since the shading layer 130a and the hard mask layer 150b have similar material characterization. In some embodiments, the etching process uses a dry etching process that selectively etches the shading layer 130a and the hard mask layer 150b. For example, the etching process uses a chlorine-containing gas (such as $Cl_2$, $SiCl_4$, HCl, $CCl_4$, $CHCl_3$, other chlorine-containing gas, or combinations thereof) and an oxygen-containing gas (such as $O_2$, other oxygen-containing gas, or combinations thereof). In some embodiments, the passivation layer 140b and the phase shift layer 120a include a material having different material characterization than the shading layer 130a and the hard mask layer 150b. Therefore, the passivation layer 140b and the phase shift layer 120a act as etch stop layers during the etching process for removing the hard mask layer 150b and the shading layer 130a, respectively. The etching process thus selectively removes the shading layer 130a and the hard mask layer 150b without removing the passivation layer 140b and the phase shift layer 120a. After removing the hard mask layer 150b, as shown in FIG. 2E, the image region 12 of the mask 10 is patterned to form a pattern (or design) of a layer of an integrated circuit device, and the frame region 14 of the mask 10 may be patterned to form alignment marks. In some embodiments, the passivation layer 140b is only disposed in the image border region 16 of the mask 10. In some embodiments, the passivation layer 140b is in physical contact with the shading layer 130b.

In some embodiments, the passivation layer 140b is located in the frame region 14, particularly adjacent to the image region 12 in the image border region 16 of the mask 10 above the shading layer 130b. Accordingly, the passivation layer 140b protects the underlying shading layer 130b. Thus, when a residue (or a particle) of the shading layer 130 is left in the image region 12, which affects the pattern printing onto the wafer, a removal process may be directly performed on the residue (or particle) without additional photoresist coating for shading layer protection and no damage for the shading layer 130b in the frame region 14, which is protected by the passivation layer 140b. In addition, a defect (such as a bubble or an impurity) that occurs in the photoresist may cause pinholes formed in the hard mask layer, however, the defect will not be transferred onto the shading layer since the shading layer is protected and covered by the hard mask layer. Therefore, cost and time for residue removing process or mask border repair process are significant reduced compared to traditional APSM process, and the quality of the mask can be improved.

In some embodiments, the hard mask layer and the passivation layer are both used as masks to pattern the phase shift layer. The hard mask layer and the shading layer have similar material characterization, and the passivation layer and the phase shift layer have similar material characterization which is different from that of the hard mask layer and the shading layer. Therefore, the hard mask layer and the shading layer may be removed simultaneously without removing the passivation layer and the phase shift layer, and the passivation layer and the phase shift layer may be removed simultaneously without removing the hard mask layer and the shading layer. Accordingly, the etching process for patterning is simplified. Therefore, cost and time for forming the mask can be significant reduced, and the quality of the mask can be improved.

In accordance with some embodiments of the disclosure, a mask includes a substrate, a phase shift layer, a shading layer and a passivation layer. The phase shift layer is disposed over the substrate. The shading layer is disposed over the phase shift layer. The passivation layer is disposed over and in physical contact with the shading layer.

In accordance with alternative embodiments of the disclosure, a mask includes a substrate, a phase shift layer, a shading layer and a silicon-containing passivation layer. The substrate includes an image region and a frame region, wherein the frame region has an image border region adjacent to the image region. The phase shift layer is disposed over the substrate in the image region and the frame region. The shading layer is disposed over the phase shift layer. The silicon-containing passivation layer is disposed over the shading layer, wherein the shading layer and the silicon-containing passivation layer are disposed in the image border region.

In accordance with yet alternative embodiments of the disclosure, a method of forming a mask includes the following steps. A phase shift layer, a shading layer, a passivation layer, and a hard mask layer are sequentially formed over a substrate. A first mask layer is formed over the hard mask layer to expose portions of the hard mask layer. The hard mask layer and the passivation layer are patterned by using the first mask layer, to expose portions of the shading layer. The first mask layer is removed. A second mask layer is formed over the hard mask layer to expose portions of the hard mask layer and the shading layer. The hard mask layer is patterned by using the second mask layer, to expose portions of the passivation layer. The shading layer is patterned by using the passivation layer as a mask, to expose portions of the phase shift layer. The second mask layer is removed. The passivation layer is patterned by using the hard mask layer. The phase shift layer is patterned by using the shading layer as a mask. The shading layer is patterned by using the passivation layer as a mask. The hard mask layer is removed.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a mask, comprising:
   forming a phase shift layer, a shading layer, a passivation layer, and a hard mask layer sequentially over a substrate, wherein the substrate comprises an image region and a frame region having an image border region adjacent to the image region, the passivation layer has a thickness of about 3.5 nm to about 5 nm, the hard mask layer has a thickness of about 3.5 nm to about 5 nm, and a material of the hard mask layer is TaGe or TaGeN;
   forming a first mask layer over the hard mask layer to expose portions of the hard mask layer;
   patterning the hard mask layer and the passivation layer by using the first mask layer, to expose portions of the shading layer;
   removing the first mask layer;
   after removing the first mask layer, forming a second mask layer over the hard mask layer to expose portions of the hard mask layer and the shading layer;
   patterning the hard mask layer by using the second mask layer to expose portions of the passivation layer;
   patterning the shading layer by using the passivation layer as a mask to expose portions of the phase shift layer;
   removing the second mask layer;
   patterning the passivation layer by using the hard mask layer;
   patterning the phase shift layer by using the shading layer as a mask;
   patterning the shading layer by using the passivation layer as a mask and removing the shading layer from the entire image region; and
   removing the hard mask layer.

2. The method of claim 1, wherein materials of the passivation layer and the phase shift layer have material characterization different from materials of the hard mask layer and the shading layer.

3. The method of claim 2, wherein the materials of the passivation layer and the phase shift layer comprise silicon-containing materials.

4. The method of claim 1, wherein the step of patterning the hard mask layer and the passivation layer by using the first mask layer comprises:
   by a first etching process, removing portions of the hard mask layer from the image region exposed by the first mask layer; and
   by a second etching process, removing portions of the passivation layer from the image region exposed by the first mask layer.

5. The method of claim 4, wherein:
   the first etching process includes using a mixture of a chloride-containing gas and an oxygen-containing gas; and
   the second etching process includes using a fluoride-containing gas.

6. The method of claim 1, wherein the steps of patterning the hard mask layer by using the second mask layer and the shading layer by using the passivation layer as a mask comprise:

by an etching process, simultaneously removing portions of the hard mask layer from the image border region exposed by the second mask layer and the shading layer from the image region exposed by the passivation layer.

7. The method of claim 6, wherein the etching process includes using a mixture of a chloride-containing gas and an oxygen-containing gas.

8. The method of claim 1, wherein the steps of patterning the passivation layer by using the hard mask layer and the phase shift layer by using the shading layer as a mask comprises:
by an etching process, simultaneously removing portions of the passivation layer from the image border region exposed by the hard mask layer and portions of the phase shift layer from the image region exposed by the shading layer.

9. The method of claim 8, wherein the etching process includes using a fluoride-containing gas.

10. The method of claim 1, wherein the step of patterning the shading layer by using the passivation layer as a mask and the step of removing the hard mask layer comprise:
by an etching process, simultaneously removing portions of the shading layer from the image region and the image border region and the remained hard mask layer from the image border region.

11. The method of claim 1, wherein the phase shift layer consists of MoSi, and the passivation layer consists of MoSi.

12. A method of forming a mask, comprising:
forming a phase shift layer, a shading layer, a passivation layer, and a hard mask layer sequentially over a substrate, wherein the substrate comprises an image region and a frame region having an image border region adjacent to the image region, the passivation layer has a thickness of about 3.5 nm to about 5 nm, the hard mask layer has a thickness of about 3.5 nm to about 5 nm, and the passivation layer consists of MoSi;
forming a first mask layer in the image region and the frame region over the hard mask layer to expose portions of the hard mask layer;
patterning the hard mask layer and the passivation layer by using the first mask layer, to expose portions of the shading layer;
removing the first mask layer;
after removing the first mask layer, forming a second mask layer over the hard mask layer to expose portions of the hard mask layer and the shading layer, wherein the image region is not covered by the second mask layer;
patterning the hard mask layer by using the second mask layer to expose portions of the passivation layer;
patterning the shading layer by using the passivation layer as a mask to expose portions of the phase shift layer;
removing the second mask layer;
patterning the passivation layer by using the hard mask layer;
patterning the phase shift layer by using the shading layer as a mask;
patterning the shading layer by using the passivation layer as a mask and removing the shading layer from the entire image region;
removing the hard mask layer; and
after removing the hard mask layer, removing residues in the image region while the shading layer in the frame region is protected by the passivation layer.

13. The method of claim 12, wherein the residues comprise residues of the shading layer.

14. The method of claim 12, wherein a thickness difference between the hard mask layer and the passivation layer is larger than 0 and smaller than or equal to 1.5 nm.

15. The method of claim 12, wherein the phase shift layer consists of MoSi.

16. A method of forming a mask, comprising:
forming a phase shift layer, a shading layer, a passivation layer, and a hard mask layer sequentially over a substrate, wherein the substrate comprises an image region and a frame region having an image border region adjacent to the image region, the passivation layer has a thickness of about 3.5 nm to about 5 nm, and the hard mask layer has a thickness of about 3.5 nm to about 5 nm, and the passivation layer consists of MoSi;
forming a first mask layer over the hard mask layer to expose portions of the hard mask layer in the image region;
removing portions of the hard mask layer and portions of the passivation layer under the portions of the hard mask layer by using the first mask layer as a mask, to expose portions of the shading layer;
removing the first mask layer;
after removing the first mask layer, forming a second mask layer over the hard mask layer to expose all of the hard mask layer in the entire image region;
removing all of the hard mask layer in the entire image region by using the second mask layer as a mask to expose of the passivation layer in the entire image region;
removing portions of the shading layer by using the passivation layer as a mask to expose portions of the phase shift layer;
removing the shading layer from the entire image region; and
removing all of the passivation layer in the entire image region and portions of the phase shift layer by using the hard mask layer and the shading layer as masks, wherein tops of all of the phase shift layer in the image region are exposed.

17. The method of claim 16, wherein the step of removing portions of the hard mask layer and portions of the passivation layer under the portions of the hard mask layer by using the first mask layer as a mask comprises:
by a first etching process, removing the portions of the hard mask layer from the image region exposed by the first mask layer; and
by a second etching process, removing the portions of the passivation layer from the image region exposed by the first mask layer.

18. The method of claim 16, wherein a material of the shading layer comprises a tantalum-containing material, a titanium-containing material, or a combination thereof.

19. The method of claim 16, wherein during the step of removing portions of the hard mask layer by using the second mask layer as a mask, the hard mask layer in the image region is entirely removed.

20. The method of claim 16, wherein during the step of removing portions of the passivation layer and portions of the phase shift layer by using the hard mask layer and the shading layer as masks, the passivation layer in the image region is entirely removed.

* * * * *